(12) United States Patent
Rinne (10) Patent No.: US 9,865,565 B2
(45) Date of Patent: Jan. 9, 2018

(54) TRANSIENT INTERFACE GRADIENT BONDING FOR METAL BONDS

(71) Applicant: Amkor Technology, Inc., Tempe, AZ (US)

(72) Inventor: Glenn Rinne, Apex, NC (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 14/963,037

(22) Filed: Dec. 8, 2015

(65) Prior Publication Data

US 2017/0162535 A1   Jun. 8, 2017

(51) Int. Cl.
*H01L 21/00* (2006.01)
*H01L 21/76* (2006.01)
(Continued)

(52) U.S. Cl.
CPC .......... *H01L 24/81* (2013.01); *H01L 23/4952* (2013.01); *H01L 23/49811* (2013.01); *H01L 24/11* (2013.01); *H01L 24/13* (2013.01); *H01L 24/16* (2013.01); *H01L 24/05* (2013.01); *H01L 2224/0401* (2013.01); *H01L 2224/05666* (2013.01); *H01L 2224/111* (2013.01); *H01L 2224/11003* (2013.01); *H01L 2224/1145* (2013.01); *H01L 2224/1146* (2013.01);
(Continued)

(58) Field of Classification Search
None
See application file for complete search history.

(56) References Cited

U.S. PATENT DOCUMENTS 5,821,627 A * 10/1998 Mori ............... H05K 3/328
257/737
2005/0023678 A1  2/2005 Weng
(Continued)

FOREIGN PATENT DOCUMENTS

JP   2005-123247     5/2005
JP   2008186155 A    8/2008
(Continued)

OTHER PUBLICATIONS

R. Tadepalli, Characterization and Requirements for Cu—Cu Bonds for Three-Dimensional Integrated Circuits, MIT Ph. D. Thesis, Feb. 2007.

(Continued)

*Primary Examiner* — Calvin Choi
(74) *Attorney, Agent, or Firm* — McAndrews, Held & Malloy, Ltd.

(57) ABSTRACT

A method and apparatus for performing metal-to-metal bonding for an electrical device and an electrical device produced thereby. For example and without limitation, various aspects of this disclosure provide a process that comprises depositing a thin metal layer on a copper pillar and then mating the copper pillar with another copper element. Atoms of the thin metal layer may, for example, form a substitutional solid solution or intermetallic compounds with copper. A concentration gradient is introduced by the thin metal layer, and diffusion at the Cu—Cu interface begins immediately. The thin metal film and the copper may, for example, diffuse until the interface disappears or substantially disappears.

22 Claims, 7 Drawing Sheets

(51) Int. Cl.
*H01L 21/30* (2006.01)
*H01L 21/46* (2006.01)
*H01L 23/00* (2006.01)
*H01L 23/495* (2006.01)
*H01L 23/498* (2006.01)

(52) U.S. Cl.
CPC ............ *H01L 2224/1147* (2013.01); *H01L 2224/1182* (2013.01); *H01L 2224/11334* (2013.01); *H01L 2224/11422* (2013.01); *H01L 2224/11822* (2013.01); *H01L 2224/1357* (2013.01); *H01L 2224/13082* (2013.01); *H01L 2224/13109* (2013.01); *H01L 2224/13111* (2013.01); *H01L 2224/13116* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01); *H01L 2224/13566* (2013.01); *H01L 2224/13611* (2013.01); *H01L 2224/13624* (2013.01); *H01L 2224/13647* (2013.01); *H01L 2224/16145* (2013.01); *H01L 2224/16227* (2013.01); *H01L 2224/16501* (2013.01); *H01L 2224/16503* (2013.01); *H01L 2224/16505* (2013.01); *H01L 2224/16507* (2013.01); *H01L 2224/8102* (2013.01); *H01L 2224/8183* (2013.01); *H01L 2224/81191* (2013.01); *H01L 2224/81193* (2013.01); *H01L 2224/81201* (2013.01); *H01L 2224/81203* (2013.01); *H01L 2224/81447* (2013.01); *H01L 2224/81895* (2013.01)

(56) References Cited

U.S. PATENT DOCUMENTS

| | | |
|---|---|---|
| 2005/0215045 A1* | 9/2005 | Rinne ............... H01L 24/11 438/614 |
| 2010/0109159 A1 | 5/2010 | Ho et al. |
| 2011/0101526 A1 | 5/2011 | Hsiao et al. |
| 2011/0193227 A1 | 8/2011 | Chuang et al. |
| 2011/0260300 A1 | 10/2011 | Chu et al. |
| 2011/0260317 A1 | 10/2011 | Lu et al. |
| 2012/0321907 A1* | 12/2012 | Hoivik ............. B81C 1/00269 428/615 |
| 2013/0180757 A1* | 7/2013 | Uno ................. H01L 23/48 174/126.2 |
| 2013/0196504 A1* | 8/2013 | Ogashiwa ............. H01L 24/11 438/656 |
| 2013/0256882 A1 | 10/2013 | Shih et al. |

FOREIGN PATENT DOCUMENTS

| | | |
|---|---|---|
| JP | 2008034756 A | 10/2011 |
| TW | 201413786 A | 4/2014 |
| WO | 2005086221 A1 | 9/2005 |
| WO | 2009122867 A1 | 11/2013 |

OTHER PUBLICATIONS

W.H. The et al., Recent Advances in Submicron Alighment 300mm Copper-Copper Thermocompressive Face-to-Face Wafer-to-Wafer Bonding and Integrated Infrared High-Speed FIB Metrology, Future Fab. Intl. Issue 34, Jul. 14, 2010.
Office Action for Application No. KR 10-2016-0022106 dated May 23, 2017.
Taiwan Search Report dated Nov. 9, 2016 for Taiwan Patent Application No. 105100259.

* cited by examiner

FIG. 10

TRANSIENT INTERFACE GRADIENT BONDING FOR METAL BONDS

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present methods for forming electrical connections, for example in integrated circuits, have shortcomings. For example, though soldering is popular, solder has a relatively low melting point, which places temperature limits on subsequent processing steps as well as on the finished product. Also, solder atoms tend to migrate along copper joints, thereby changing the electrical and mechanical properties of soldered joints as they age. Direct copper to copper (Cu—Cu) bonds obviate the need for solder, but cost effective processes for producing Cu—Cu bonds on a large scale have proven elusive since high temperatures, high pressures, and long dwell times complicate the assembly process.

SUMMARY

Various aspects of this disclosure provide a method and apparatus for performing metal-to-metal bonding for an electrical device and an electrical device produced thereby. For example and without limitation, various aspects of this disclosure provide a process that comprises depositing a thin metal layer on a copper pillar and then mating the copper pillar with another copper element. Atoms of the thin metal layer may, for example, form a substitutional solid solution or intermetallic compounds with copper. A concentration gradient is introduced by the thin metal layer, and diffusion at the Cu—Cu interface begins immediately. The thin metal film and the copper may, for example, diffuse until the interface disappears or substantially disappears.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure. Additionally, the term "on" will be utilized in the document to mean both "on" and "directly on" (e.g., with no intervening layer).

In the drawings, various dimensions (e.g., layer thickness, width, etc.) may be exaggerated for illustrative clarity. Additionally, like reference numbers are utilized to refer to like elements through the discussions of various examples.

In an example implementation provided herein, a method is provided that comprises providing a first device (or device component) having at least one metal pillar (or other metal structure or element) of a first metal, providing a second device (or device component) having at least one metal element of the first metal, depositing a layer (or a film) of a second metal on the at least one metal pillar, wherein the second metal is a metal capable of diffusing into the metal pillar to form a substitutional solid solution with the first metal, mating the first and second devices to bring the layer on the at least one metal pillar in contact with the at least one metal element, and applying a pressure of no more than 100 MegaPascals (MPa) while diffusion of the layer of the second metal into the at least one metal pillar and into the at least one metal element takes place.

In another example implementation provided herein, a method is provided that includes applying a metal layer (e.g., a metal film, etc.) to a copper pillar (or other metal structure) on a semiconductor die, wherein the metal layer forms a concentration gradient with the copper pillar to drive diffusion, and mating the metal layer to a copper element on a semiconductor package, or a component thereof, before the metal layer has fully diffused into the copper pillar.

In yet another example implementation provided herein, an apparatus (e.g., a packaged integrated circuit, or subassembly or portion thereof, etc.) is provided that includes a first device (or device component) having a first conductive portion, a second device (or device component) having a second conductive portion, and a copper pillar (or other metal structure) interconnecting the first conductive portion and the second conductive portion, the copper pillar comprising atoms of a second metal that form a substitutional solid solution with copper.

Figure 1:
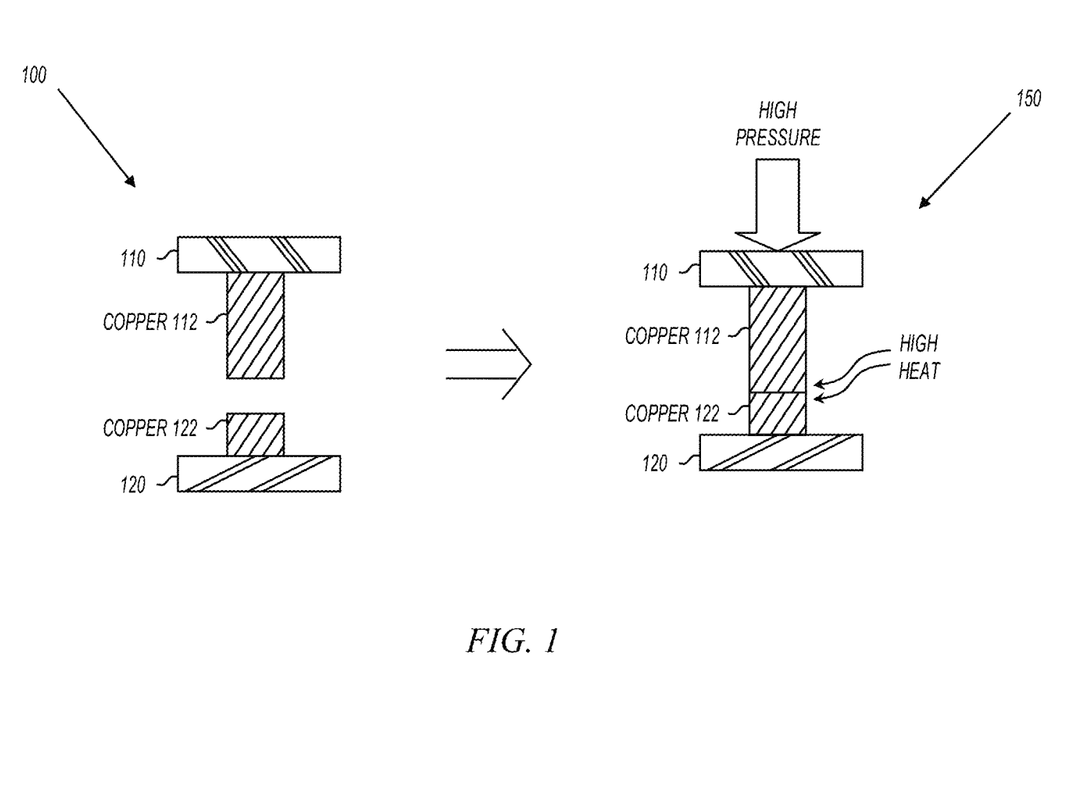
FIG. 1 shows an example copper to copper (Cu—Cu) bond process.

FIG. 1 shows an example copper-to-copper (Cu—Cu) bonding process. As shown at label 100, two substrates 110, 120 have copper elements 112, 122 that are to be joined. At label 150, the substrates 110, 120 are brought together to bring the copper element 112 in contact with the copper element 122. To effect (or perform) a Cu—Cu bond at the interface between the copper elements 112 and 122, a high pressure and high heat are generally applied for a significant dwell time. If the two surfaces of the copper elements 112 and 122 are clean (e.g., perfectly clean), then random atomic motion will eventually cause atoms to traverse the interface between the two surfaces, thus blurring the interface, and over time the interface will eventually disappear. However, this is a slow process because the atomic motion is generally random (e.g., mostly or completely random). Example pressures may for example be greater than 200 MegaPascals (MPa), example temperatures may for example be greater than 300 C, and example dwell times may for example be on the order of an hour to several hours.

Figure 2:
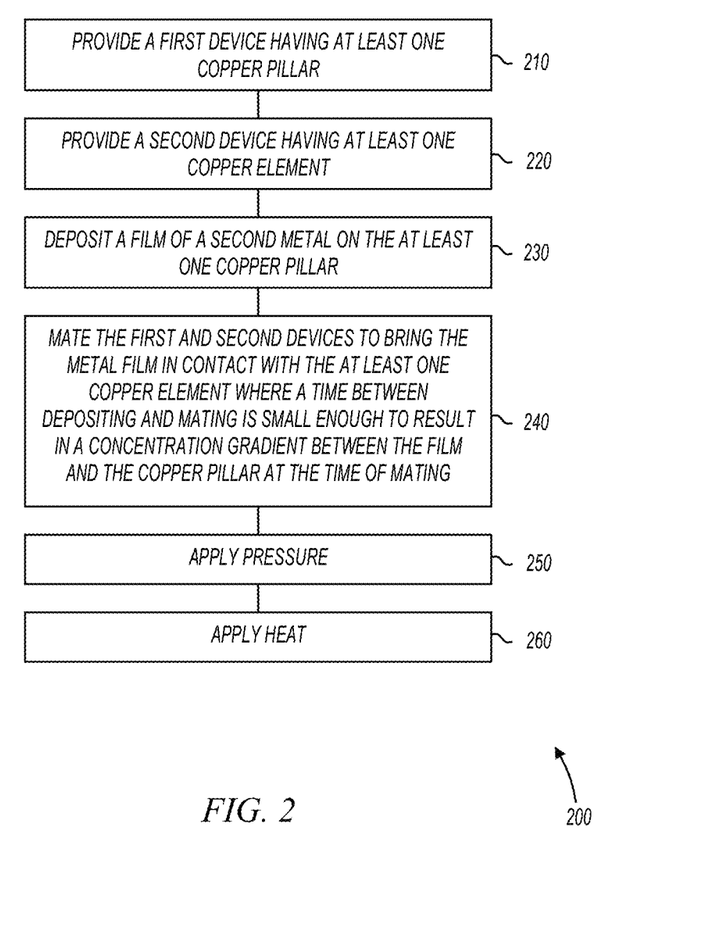
FIG. 2 shows a flow diagram of an example method of manufacturing an electrical device and/or a component thereof, in accordance with various aspects of the present disclosure.
Figure 7:
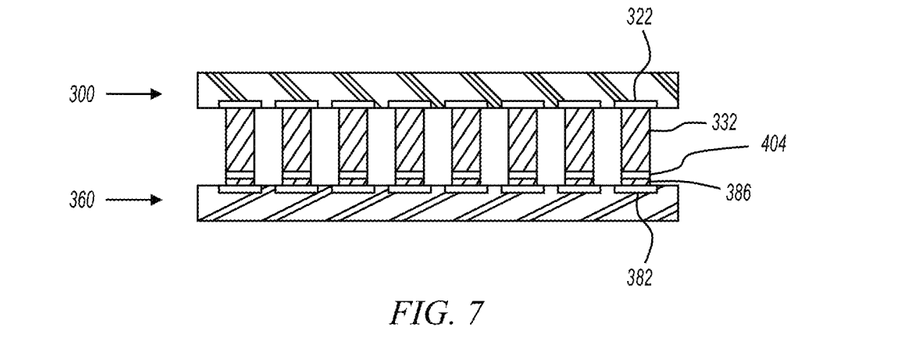
FIG. 7 shows mating the first device and the second device to make contact between the metal film on the copper pillars and the copper elements, in accordance with various aspects of the present disclosure.
Figure 8:
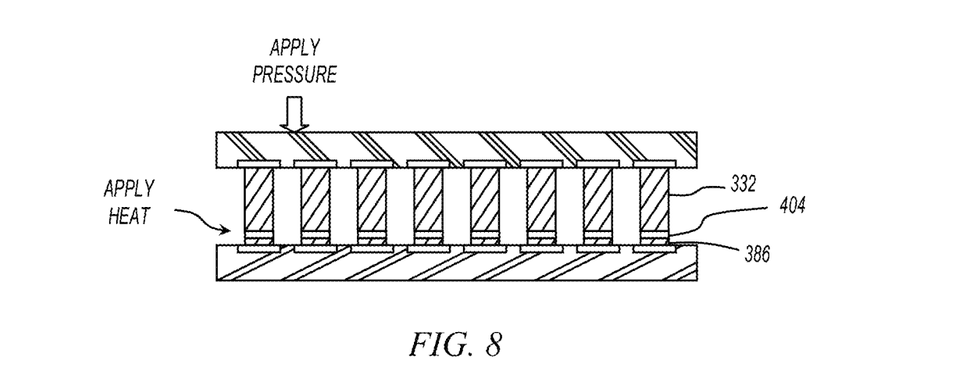
FIG. 8 shows the application of heat and pressure, in accordance with various aspects of the present disclosure.
Figure 9:
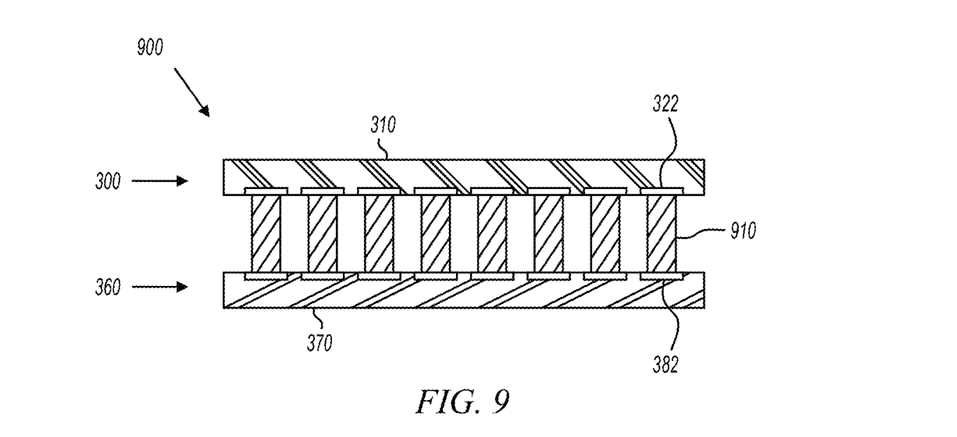
FIG. 9 shows an apparatus with Cu—Cu bonds, in accordance with various aspects of the present disclosure.

FIG. 2 shows a flow diagram of an example method 200 of manufacturing an electrical device and/or a component thereof, in accordance with various aspects of the present disclosure. The electrical device may comprise any of a variety of characteristics, non-limiting examples of which are provided herein. For example, the electrical device may comprise a semiconductor device, an active or passive electrical device, a processor, a memory, an application-specific integrated circuit, a digital signal processor, a math coprocessor, a graphics processor, etc.). Various aspects of the example method 200 may, for example, comprise forming metal bonds, in accordance with various aspects of the present disclosure. FIGS. 3 to 8 generally provide views illustrating example devices and/or components thereof at various stages of manufacture according to the flow sequence of FIG. 2, and FIG. 9 is a view of an example semiconductor device (e.g. a semiconductor die and substrate) comprising metal bonds formed, in accordance with various aspects of the present disclosure.

Metal-to-metal bonding processes are described herein in the context of specific example metals. For example copper-copper (Cu—Cu) bonds are described in detail. Although example copper implementations are described in detail, the scope of this disclosure is not limited to copper or copper-copper bonds. For example, metals other than copper may be bonded as described herein. Such other metals may, for example, comprise any low melting point metals such as silver, tin, indium, lead, gold, etc.

Referring to FIG. 2, such figures shows a flow diagram of an example method 200 of manufacturing an electrical device and/or a component thereof, in accordance with various aspects of the present disclosure. The example method 200, for example a Cu—Cu bonding method, may for example comprise block 210, at which a first device having at least one copper pillar is provided or formed, block 220, at which a second device having at least one copper element is provided or formed, block 230, at which a layer (which may also be referred to herein as a film) of a second metal is deposited (or formed) on the at least one copper pillar, block 240, at which the first and second devices are mated to bring the at least one copper pillar (or second metal deposited thereon) in contact with the at least one copper element, where a time between the depositing and the mating is small enough to result in a concentration gradient between the film and the copper pillar and/or between the film and the copper element at the time of mating, block 250, at which pressure is applied, and block 260, at which heat is applied.

Various expects of the present disclosure in accordance with FIG. 2 provide a Cu—Cu bonding process. The process is described generally in the context of bonding at least one copper pillar to at least one copper element, although the scope of this disclosure is not limited to bonding pillars to elements or vice-versa. For example, metals of any size or shape (including pillars, posts, pads, bumps, balls, landing, traces, wires, plated features, etc.) may be bonded in accordance with the various aspects of the present disclosure.

In an example implementation, the film (or thin layer) of second metal that is deposited on the copper pillar forms a concentration gradient between the second metal and the copper of the copper pillar. The concentration gradient drives diffusion of copper atoms of the copper pillar into the second metal and diffusion of atoms from the second metal into the copper. When the copper pillar is brought into contact with the copper element (e.g., with the film of second metal therebetween), two concentration gradients exist: a first one at a first interface between the second metal and the copper pillar; and a second one at a second interface between the second metal and the copper element. Diffusion continues in all directions until at least substantially all of the second metal is fully diffused into the copper and the interface (e.g., at least a portion, most, substantially all, or the entire interface) essentially disappears. In some example implementations, the first and/or second interfaces (or portions thereof) can be substantively indistinguishable or undetectable after diffusion of the concentration gradient is completed.

Diffusion may occur rapidly because of the concentration gradient. The time between depositing the second metal (e.g., on the copper pillar, etc.) and mating the devices (e.g., mating the copper pillar and the copper element with the second metal therebetween, etc.) is kept small so that the concentration gradient(s) will still exist when the devices are mated. The actual diffusion time may vary based on the thickness of the metal layer (e.g., a film), where for example thinner films may correspond to shorter times. Examples are provided herein.

In some example implementations, the second metal is a metal capable of forming a substitutional solid solution with copper (or with an alternative metal if an alternative metal is used instead of copper). For example, the second metal may be a metal from a group that comprises gold (Au), nickel (Ni), silver (Ag), palladium (Pd), platinum (Pt), zinc (Zn), combinations thereof, alloys thereof, etc. In other example implementations, the second metal is a metal that forms an intermetallic compound (IMC) at the interface after the diffusion is complete.

The examples described herein are also applicable to bonding metal alloys. When bonding metal alloys, the second metal may for example be a metal that is a relatively fast diffuser in the alloy and preferably forms substitutional solid solutions in the alloy.

Figure 3:
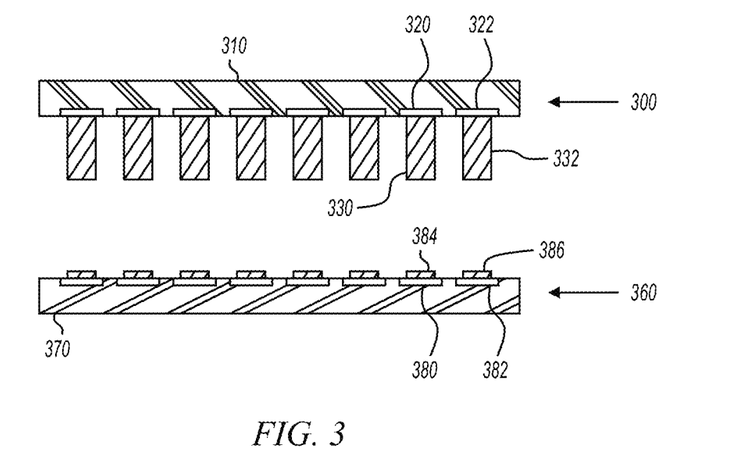
FIG. 3 shows an example first device having copper pillars and an example second device having copper elements, in accordance with various aspects of the present disclosure.

At block 210 of the example method 200, a first device having at least one copper pillar is provided. At block 220 of the example method 200, a second device having at least one copper element is provided. Blocks 210 and 220 are, for example, illustrated at FIG. 3. As illustrated in FIG. 3, a first device 300 comprising a substrate 310, conductive portions 320, 322, and at least one copper pillar 330, 332 is provided. Also as illustrated in FIG. 3, a second device 360 comprising a substrate 370, conductive portions 380, 382, and at least one copper element 384, 386 is provided (220, FIG. 2). Note that the substrates 310, 370 may comprise characteristics of any of a variety of substrates (e.g., a semiconductor die, an active or passive electrical component, a printed wire board, a lead frame, an interposer, etc.).

In some example implementations, the first device 300 (or device component) comprises a semiconductor die as the substrate 310, which has multiple copper pillars 330, 332 formed thereon (e.g., on an active and/or passive surface thereof) as part of a previous manufacturing operation. In other example implementations, the first device 300 is a processed silicon wafer that comprises many semiconductor die comprising copper pillars formed thereon as part of a previous manufacturing operation. The copper pillars 330, 332 may, for example, have a very small diameter and a very fine pitch (e.g., center-to-center spacing). For example, in some example implementations, the copper pillars 330, 332 may have a diameter of from about 20 microns to about 150 microns, and/or may have a pitch of about 40 microns to about 300 microns. Copper pillars may, for example, have any diameter and pitch without departing from the scope of the present disclosure.

As an example formation of a copper pillar, the copper pillar 332 may have been formed on the conductive portion 322 (e.g., a bonding pad, an aluminum bonding pad, etc.) of the first device 300 by forming (e.g., sputtering, etc.) an under bump metal (e.g., TiW, etc.) on the conductive portion 322 and plating copper onto the under bump metal by plating copper onto the under bump metal through a template (e.g., of a dielectric, photoresist, etc.). Note that the formation of the copper pillar 332 on the conductive portion 322 may be such that an undercut (or gap) exists between edges of the copper pillar 332 and the conductive portion 322.

FIG. 3 and other figures discussed herein generally show a two-dimensional cross section illustrating single rows of copper pillars and copper elements. In some example implementations, two-dimensional arrays of copper pillars and copper elements are provided, and two-dimensional arrays of Cu—Cu bonds are formed. Any number of copper pillars and copper elements in any orientation may be included without departing from the scope of the present disclosure.

The conductive portions 320, 322 of the first device 300 make electrical (and/or mechanical) contact with the copper pillars 330, 332. The conductive portions 320, 322 may, for example, comprise metal layers formed on any type of substrate 310. For example, the conductive portions 320, 322 may comprise exposed metal layers, such as pads and/or lands, formed on a semiconductor die (e.g., an active or passive surface thereof), on a redistribution layer (RDL), on any suitable organic or inorganic substrate, on any printed wire board or laminate substrate, on any component of a semiconductor package, on a motherboard, etc. In some example implementations, the first device 300 comprises many layers of conductive material, semiconductor material, doped semiconductor material, dielectric material, conductive layers, etc. (not shown). These layers may, for example, be formed using general semiconductor manufacturing processes.

The conductive portions 380, 382 of the second device 360 make electrical (and/or mechanical) contact with the copper elements 384, 386. The conductive portions 380, 382 may, for example, comprise metal layers formed on any type of substrate 370. For example, similar to the conductive portions 320, 322 of the first device 300, the conductive portions 380, 382 of the second device 360 may comprise exposed metal layers, such as pads and/or lands, formed on a semiconductor die (e.g., an active or passive surface thereof), on a redistribution layer (RDL), on any other suitable organic or inorganic substrate, on any printed wire board or laminate substrate, on any component of a semiconductor package, on a motherboard, etc.

The copper elements 384, 386 of the second device 360 may, for example, comprise exposed copper elements that are electrically (and/or mechanically) connected to the conductive portions 380, 382 of the second device 360. In some example implementations, combinations of conductive portions and copper elements are each formed as a single unitary conductor. For example, the conductive portion 380 and the copper element 384 may be portions of a single copper pad exposed at the surface of the second device 360. In other example implementations, the copper elements 384, 386 are distinctly separate from the conductive portions 380, 382. For example, in some example implementations, the copper elements 384, 386 may be copper pillars formed on conductive portions 380, 382, similar to the construction of copper pillars on first device 300.

Providing the first device 300 and the second device 360 (e.g., at blocks 210, 220 of FIG. 2) may or may not include the manufacture of the first and second devices 300, 360. For example, in some example implementations, providing the first device includes the manufacture of the first device (e.g., at a prior manufacturing process). In other embodiments, providing the first device includes retrieving and/or offering a device that has been previously manufactured, shipped, and/or stored. Also for example, in some example implementations, providing the second device includes the manufacture of the second device (e.g., at a prior manufacturing process). In other example implementations, providing the second device includes retrieving and/or offering a device that has been previously manufactured, shipped, and/or stored.

In some example implementations, copper pillars and copper elements are pure copper (Cu), and in other example implementations, copper pillars and/or copper elements include impurities such that they are not pure copper and/or such that they can be copper alloy(s). As used herein, the term "copper" refers to pure copper and slightly impure copper. For example, in some example implementations, the copper may include trace amounts of lead, tin, zinc, sulfur, boron, and/or other elements.

The remainder of this description sometimes refers to the first device with copper pillars as a semiconductor die and sometimes refers to the second device with copper elements as a semiconductor package (e.g., a package substrate, etc.), although the scope of the disclosure is not so limited. Any number or type of devices and/or components may include Cu—Cu bonds formed using the methods described herein. For example, the first device may comprise a semiconductor die, an upper package, any of a variety of active or passive components, etc., and the second device may comprise a packaging substrate, an interposer, another semiconductor die, a lower semiconductor package, etc.

Figure 4:
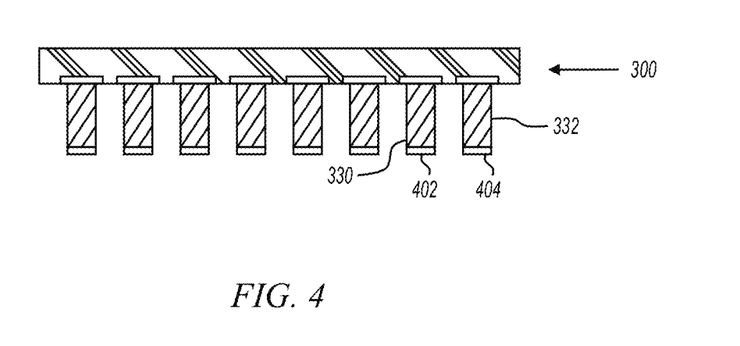
FIG. 4 shows an example metal layer deposited on the copper pillars of the first device, in accordance with various aspects of the present disclosure.

Block 230 of the example method 200 comprises depositing a film (or thin layer) of a second metal on the at least one copper pillar (e.g., as provided at block 210). Block 230 is illustrated, for example, at FIG. 4. As illustrated in FIG. 4, a metal film 402, 404 (e.g., a thin metal layer) is deposited on the copper pillars 330, 332 of the first device 300. In some example implementations, the metal film 402, 404 comprises metal atoms of a second metal that form a substitutional solid solution with copper. In such examples, the second metal may be referred to as a Transient Interface Gradient (TIG) metal, for example because it creates a temporary concentration gradient between the metal film 402, 404 and the copper pillars 330, 332. This concentration gradient drives diffusion of the TIG metal into the copper and drives diffusion of the copper into the TIG metal. Accordingly, shortly after deposition, the TIG metal film will start diffusing into the copper and the interface between the TIG metal and the copper will begin to disappear.

In other example implementations, the metal film 402, 404 (e.g., a thin metal layer) comprises metal atoms of a second metal that form an intermetallic compound with copper after diffusion is complete. For example, the metal film 402, 404 may comprise tin (Sn), which forms Cu3Sn and Cu6Sn5 as intermetallic compounds. Also for example, the metal film 402, 404 may comprise aluminum (Al), which forms Al2Cu as an intermetallic compound.

Deposition of the metal film 402, 404 may be performed in any of a variety of manners without departing from the scope of the present disclosure. For example, in some example implementations, the metal film 402, 404 is formed using techniques such as sputter deposition. Other example methods for forming the metal film 402, 404 are described herein, for example with reference to FIGS. 5 and 6.

The thickness of the metal film 402, 404 may, for example, be on the order of ten nanometers (nm) to one micron (or thicker in some cases). In some example implementations, the desired thickness of the metal layer 402, 404 may be determined based on relative volumes of copper and the second metal, as well as on desired diffusion times. For example, larger thicknesses may result in relatively longer diffusion times and more time between process steps during the bonding process than smaller thicknesses. Also for example, smaller thicknesses may provide a relatively lower final concentration of the second metal in the copper in the final fully diffused Cu—Cu bond than larger thicknesses, however, diffusion may occur faster. In some example implementations, the thickness of the second metal film 402, 404 is selected to provide a final concentration of the second metal in the copper of less than 10%. In other example implementations, the thickness of the second metal film 402, 404 is selected to provide a final concentration of the second metal in the copper of less than 1.0%. In still further example implementations, the thickness of the second metal film 402, 404 is chosen to provide a final concentration of the second metal in the copper of less than 0.5%.

Although the metal film 402, 404 is shown deposited on the copper pillars 330, 332 of the first device 300, the scope of the present disclosure is not limited thereto. For example, in some example implementations, the metal film 402, 404 is deposited on the copper elements 384, 386 of the second device 360 instead of on the copper pillars 330, 332. In still further example implementations, the metal film 402, 404 is deposited on both the first device 300 and the second device 360. Note that although the metal film 402, 404 is illustrated as only being deposited on the end surfaces of the copper pillars 330, 332, the scope of this disclosure is not limited thereto. For example, the metal film 402, 404 may also be formed on at least portions of the sides of the copper pillars 330, 332, for example proximate the end surfaces. In such example implementations, the width of the metal film 402, 404 may be wider than the copper pillars 330, 332.

Figure 5:
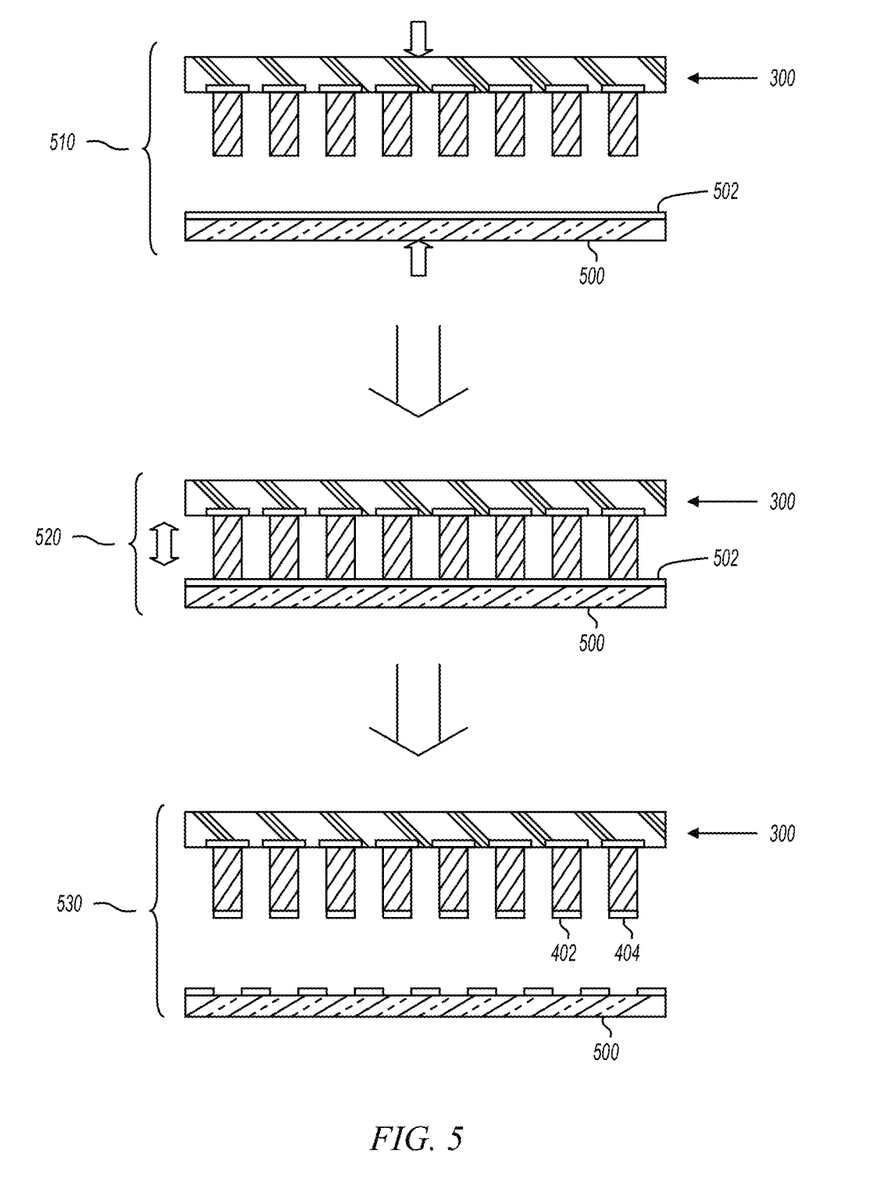
FIG. 5 shows an example method of depositing a film of a second metal, for example using a film transfer technique, in accordance with various aspects of the present disclosure.

FIG. 5 shows an example method of depositing a film of a second metal, for example on copper pillars or other structure, in accordance with various aspects of the present disclosure. For example, FIG. 5 shows a metal film 502 adhered to a surface 500 prior to, and after, depositing respective portions 402, 404 of the metal film 502 on the copper pillars 330, 332. Labels 510, 520, and 530 show a sequence of operations that result in respective portions 402, 404 of the metal film 500 being deposited on the copper pillars 330, 332 of the first device 300.

At label 510, a metal film 502 (or layer) is adhered to a surface 500. In some example implementations, the surface 500 is a smooth surface such as glass or other polished surface. A light adhesive (not shown) may, for example if needed, be applied to the surface 500 prior to depositing (or otherwise forming) a thin film 502 of the second metal on the surface 500. A light adhesive (or no adhesive) may, for example, be used so that respective portions 402, 404 of the metal film 502 will release from the surface 500 when in contact with the copper pillars 330, 332, as described below.

At label 520, the copper pillars 330, 332 of the first device 300 (or end portions thereof) are brought into contact with the metal film 502. After a short period of time, diffusion begins and portions of the metal film 502 are more strongly bonded to the copper pillars 330, 332 than to the surface 500. At label 530, the first device 300 is pulled away from the surface 500 resulting in respective portions 402, 404 the metal film 502 separating from the surface 500 and from the rest of the metal film 502 and remaining on the copper pillars 330, 332. At this stage, the first device 300 is in the same processing state as shown in FIG. 4.

Figure 6:
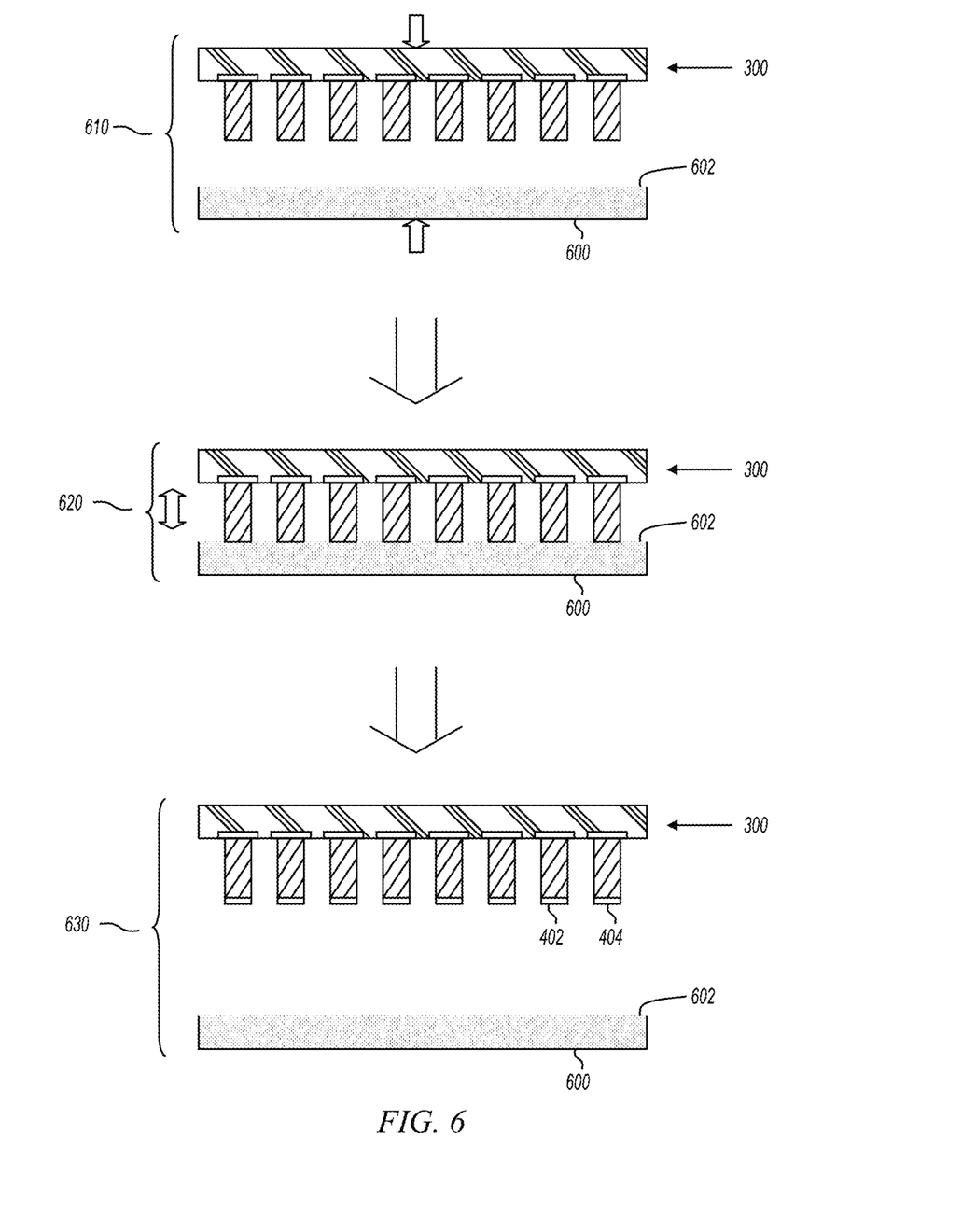
FIG. 6 shows another example method of depositing a film of a second metal, for example using colloidal suspension of metal nanoparticles, in accordance with various aspects of the present disclosure.

FIG. 6 shows another example method of depositing a film of a second metal, for example on copper pillars or other structures, in accordance with various aspects of the present disclosure. For example, FIG. 6 shows a colloidal suspension of metal nanoparticles prior to depositing on the copper pillars. Labels 610, 620, and 630 show a sequence of operations that result in the metal film 402, 404 being deposited on the copper pillars 330, 332 of the first device 300.

At label 610, a colloidal suspension of metal nanoparticles 602 is prepared in a container 600. At label 620, the copper pillars 330, 332 of the first device 300 are brought in contact with the colloidal suspension 602. After a short period of time, diffusion begins and a thin film of metal nanoparticles forms on the copper pillars 330, 332. At label 630, the first device 300 is pulled away from the colloidal suspension 602 resulting in the thin metal film 402, 404 on the copper pillars 330, 332. At this stage, first device 300 is in the same processing state as shown in FIG. 4.

At block 240, the first device 300 and the second device 360 are mated to bring the metal film 402, 404 (e.g., as deposited at block 230) into contact with the at least one copper element 384, 386 of the second device 360. As illustrated in FIG. 7, the first device 300 and the second device 360 are mated to make contact between the metal film 402, 404 on the copper pillars 330, 332 and the copper elements 384, 386. The first device 300 and the second device 360 are mated so that the metal film 402, 404 on the copper pillars 330, 332 is sandwiched between the copper pillars 330, 332 of the first device 300 and the copper elements 384, 386 of the second device 360. For example, in FIG. 7, the metal film 404 is shown sandwiched between the copper pillar 332 and the copper element 386.

As described above, a concentration gradient exists at the boundary (or interface) between the metal film 404 and the copper pillar 332 of the first device 300. A concentration gradient also exists at the boundary (or interface) between the metal film 404 and the copper element 386 of the second device 360. These concentration gradients drive diffusion. Atoms of the metal film 404 diffuse in both directions into the copper pillar 332 and copper element 386, and copper atoms diffuse into the metal film 404 from both the copper pillar 332 and the copper element 386, until the boundaries disappear (or substantially disappear) and a substitutional solid solution of copper and the second metal is formed.

The resulting concentration of the second metal within the copper may be very low. As an example, if the copper pillars are 25 microns tall and the metal film has a thickness of 250 nanometers thickness, the resulting concentration of second metal atoms in copper may be less than one part in 100, or less than 1%. In some example implementations, the ratio of copper volumes to second metal volumes can result in concentrations less than 0.5%. For example, for 25 micron copper pillars and second metal layers of 100 nanometer thickness, the resulting concentration may be about 0.4% or less. These concentrations are easily detectable using scanning electron microscopes and EDS spectroscopy.

The time between depositing the second metal (e.g., at block 230 of FIG. 2) and mating (e.g., at block 240 of FIG. 2) is kept small enough to result in a concentration gradient between the film of the second metal and the at least one copper pillar at a time of mating. In some example implementations, this time is on the order of minutes, and in other example implementations, this time is on the order of hours. For example, the concentration gradient is established the moment the second metal is deposited on the copper, and diffusion begins immediately. Mating (e.g., at block 240 of FIG. 2) is performed before such diffusion is complete so the concentration gradient still exists. The time between depositing the metal film and mating may also be a function of size and/or volume of the metal film and copper as well as temperature. For example, very thin gold (Au) films begin to show exposed copper atoms on the surface about one hour after depositing the thin film on the copper.

At blocks 250 and 260, pressure and heat are applied. FIG. 8, for example, shows the application of heat and pressure. In some example implementations, heat and pressure are applied as shown in FIG. 8, although this is not a limitation of the present disclosure. For example, heat need not be applied, because diffusion across the concentration gradient will occur without heat, but the application of heat increases mobility and reduces the process time. In some example scenarios, heat is applied at temperatures of, for example, less than 200 C. Such low temperatures may, for example, be safe for various electronic components and/or connections therebetween. For example, such low temperatures may be below the melting point of solder.

Also for example, pressure need not be applied except to align the parts and keep the copper pillars and elements in contact during diffusion. Pressures applied may, for example, be in the range of zero to about 10 MPa.

FIG. 9 shows an apparatus with Cu—Cu bonds, in accordance with various aspects of the present disclosure. The apparatus 900 may, for example, result from execution of the example method 200 of FIG. 2. The apparatus 900 may, for example, comprise an electronic device, a packaged electronic device, a portion of a packaged electronic device, etc. The example apparatus 900 comprises devices 300 and 360. The first device 300 (or a substrate 310 thereof) comprises a plurality of conductive portions, one of which is shown at the conductive portion 322. The second device 360 (or a substrate 370 thereof) also comprises a plurality of conductive portions, one of which is shown at the conductive portion 382. The apparatus 900 also comprises a plurality of copper pillars that are a result of the Cu—Cu bonding processes described herein. One such copper pillar is shown at copper pillar 910.

The copper pillar 910 is the result of the film of second metal 404 diffusing into the copper pillar 332 of the first device 300 and diffusing into the copper element 386 of the second device 360 (see FIG. 8). In some example implementations, atoms of the second metal form a substitutional solid solution with the copper (e.g., of the copper pillar 332 and/or the copper element 386) at a concentration of less than 10%. In other example implementations, atoms of the second metal form a substitutional solid solution with the copper at a concentration of less than 1.0%. In still further example implementations, atoms of the second metal form a substitutional solid solution with the copper at a concentration of less than 0.5%. Various example implementations also form intermetallic compounds at the above-stated final concentrations. Note that the respective amounts of the diffusing need not be equal or symmetrical, for example between the copper pillar 332 and the copper element 386. For example, as explained herein, there may be a significant time delay between deposition block 230 and mating block 240, which may result in relatively more diffusing into the copper pillar (or other element) on which the film is deposited at block 230 than into the copper element (or other structure) with which the film is brought into contact at block 240.

Figure 10:
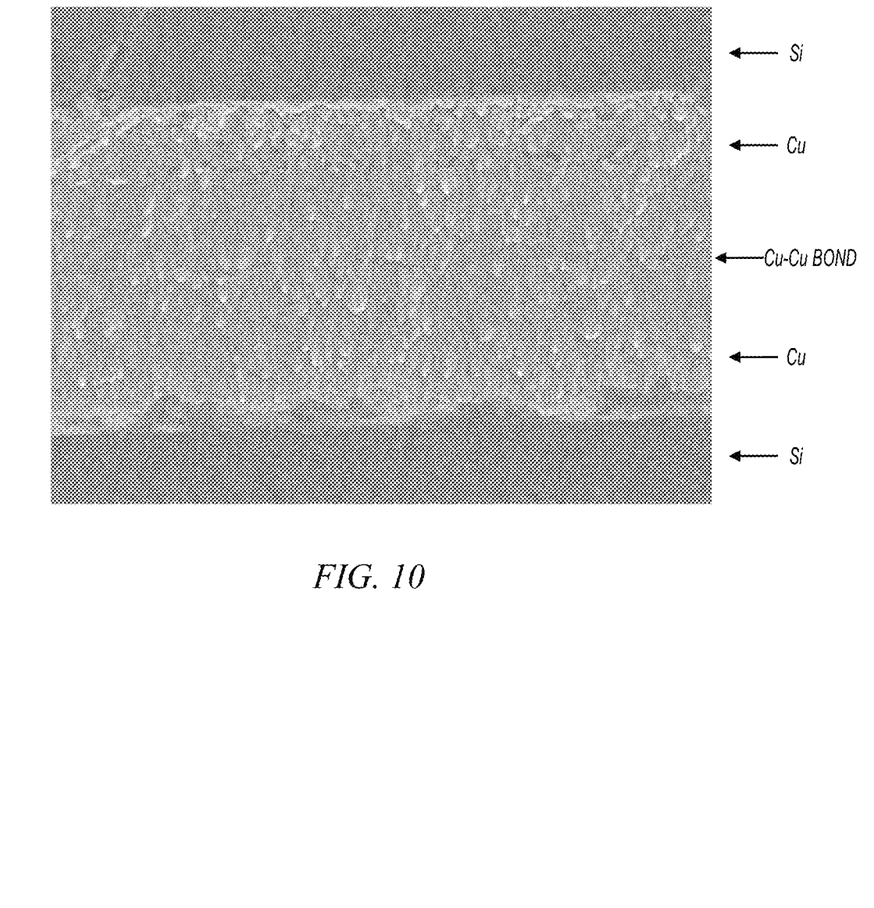
FIG. 10 shows a photograph of experimental results, in accordance with various aspects of the present disclosure.

In an example implementation, two silicon die one millimeter (mm) square may be sputter coated with an adhesion layer and a 3 mm thick copper layer. One die may, for example, be sputtered coated with a very thin film of AuPd. The die may then, for example, be mated face-to-face, placed on a 165 C hot plate in air, and a pressure of 0.7 MPa applied using a room temperature granite weight for 60 minutes. The bonded pair may then, for example, be cross sectioned, polished, and ion milled for SEM analysis. A photograph of an example result is shown in FIG. 10. In this example implementation, a fully diffused final product lacks voids and gaps indicating the applied pressure is sufficient and likely higher than necessary, that the applied heat is sufficient and likely higher than necessary, and/or that the example bond time of 60 minutes is sufficient and likely longer than necessary.

In summary, various aspects of the present disclosure provide a method and apparatus for performing metal-to-metal bonding for an electrical device, and an electrical device produced thereby, for example comprising depositing a thin metal layer on a copper pillar and then mating the copper pillar with another copper element. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method comprising: providing a first substrate comprising a first metal structure of a first metal; providing a second substrate comprising a second metal structure of the first metal; depositing a layer of a second metal on the first metal structure, wherein the second metal is a metal capable of diffusing into the first metal structure to form a substitutional solid solution with the first metal of the first metal structure; after said depositing, mating the first and second substrates to bring the deposited layer on the first metal structure in direct contact with the second metal structure; and applying a pressure of less than 100 MPa while diffusion of the layer of the second metal into the first metal structure and into the second metal structure takes place, wherein said depositing a layer comprises: placing the first metal structure in contact with the layer of the second metal, which is bonded to a surface, to diffusion-bond the layer of the second metal to the first metal structure; and pulling the diffusion-bonded layer of the second metal away from the surface to separate the diffusion-bonded layer of the second metal from a remainder of the second metal.

2. The method of claim 1, wherein said applying a pressure comprises applying a pressure of less than 10 MPa.

3. The method of claim 1, wherein a time between said depositing and said mating is small enough to result in a concentration gradient between the layer of the second metal and the first metal structure at a time of said mating.

4. The method of claim 1, comprising waiting a time delay between said depositing the layer of the second metal layer and said mating, wherein the time delay is long enough to result in asymmetric diffusion of the second metal layer into the first and second metal structures.

5. The method of claim 1, wherein the layer of the second metal is no greater than 250 nanometers thick.

6. The method of claim 1, wherein the second metal is one metal of the group: gold, nickel, silver, palladium, platinum, and/or zinc.

7. The method of claim 1, wherein the first metal is one metal of the group: copper, silver, tin, indium, lead, and gold.

8. The method of claim 1, wherein the layer of the second metal has a volume that results in less than a 1% concentration when fully diffused in the first metal structure and the second metal structure.

9. The method of claim 1, comprising raising a temperature of the first metal structure to no more than 200 degrees Celsius.

10. A method comprising: receiving a semiconductor die comprising a copper pillar; receiving a substrate comprising a copper element; applying a metal layer of a second metal to the copper pillar on the semiconductor die but not on the copper element of the substrate, wherein the metal layer forms a concentration gradient with the copper pillar to drive diffusion; and after said applying the metal layer to the copper pillar on the semiconductor die, mating the applied metal layer directly to the copper element on the substrate before the metal layer has fully diffused into the copper pillar.

11. The method of claim 10, comprising waiting a time delay between said applying the metal layer and said mating, wherein the time delay is long enough to result in asymmetric diffusion of the metal layer into the copper pillar and the copper element.

12. The method of claim 10, wherein the metal layer comprises metal atoms that form an intermetallic compound at a boundary between the copper pillar and the copper element and/or that form a substitutional solid solution with copper.

13. An apparatus comprising: a first substrate of a semiconductor die comprising a first conductive portion comprising a bond pad on an active surface of the semiconductor die; a second substrate comprising a second conductive portion; and a metal structure of a first metal and interconnecting the first conductive portion and the second conductive portion, the metal structure comprising atoms of a second metal that form a substitutional solid solution with the first metal, and wherein the second metal is diffused into the metal structure asymmetrically.

14. The apparatus of claim 13, wherein the second substrate comprises a substrate of a semiconductor die.

15. The apparatus of claim 13, wherein the second substrate comprises a printed wire board package substrate.

16. The apparatus of claim 13, wherein the metal structure comprises a copper pillar.

17. The apparatus of claim 14, comprising an under bump metallization on the first conductive portion, wherein the copper pillar is on the under bump metallization and an undercut is between edges of the copper pillar and the first conductive portion.

18. The apparatus of claim 13, wherein a concentration of the second metal in the metal structure is less than 1%.

19. The apparatus of claim 13, wherein a concentration of the second metal in the metal structure is less than 0.5%.

20. The apparatus of claim 13, wherein the metal structure comprises: a first portion comprising the first metal; and a second portion comprising the first metal, wherein the second portion is joined to the first portion at an interface that is substantially indistinguishable from the first and second portions.

21. The apparatus of claim 20, wherein the second metal is fully diffused into the first metal.

22. The method of claim 10, wherein said depositing comprises dipping the copper pillar in a colloidal suspension of nanoparticles of the second metal for a determined period of time that is long enough for the nanoparticles to diffusion bond with the copper pillar.

* * * * *